(12) United States Patent
Shimoto et al.

(10) Patent No.: US 6,444,403 B1
(45) Date of Patent: Sep. 3, 2002

(54) RESIN LAMINATED WIRING SHEET, WIRING STRUCTURE USING THE SAME, AND PRODUCTION METHOD THEREOF

(75) Inventors: Tadanori Shimoto, Tokyo (JP); Koji Matsui, Tokyo (JP); Takero Teramoto, Tokyo (JP); Hironobu Kawasato, Chiba (JP)

(73) Assignees: NEC Corporation, Tokyo (JP); Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/574,222

(22) Filed: May 19, 2000

(30) Foreign Application Priority Data

May 20, 1999 (JP) ............................................. 11-140788

(51) Int. Cl.⁷ .............................. G03F 7/00; G03F 7/095
(52) U.S. Cl. ...................... 430/313; 430/311; 430/312; 430/314; 430/318
(58) Field of Search ................................ 430/311, 313, 430/314, 318, 312

(56) References Cited

U.S. PATENT DOCUMENTS 5,854,325 A * 12/1998 Hosomi et al. ............... 524/425
6,156,870 A * 12/2000 Morita et al. ................ 528/353
6,204,565 B1 * 3/2001 Shimoto et al. ............. 257/783
6,249,034 B1 * 6/2001 Li ................................ 257/432

FOREIGN PATENT DOCUMENTS

| JP | 8-111584 | 4/1996 |
| JP | 10-247772 | 9/1998 |

* cited by examiner

Primary Examiner—Mark F. Huff
Assistant Examiner—Nicole Barreca
(74) Attorney, Agent, or Firm—Young & Thompson (57) ABSTRACT

A method of making a multilayer buildup printed circuit board and mounting substrate wherein a resin laminated wiring sheet, which has a copper foil, an epoxy-acrylate photosensitive resin composition having a fluorene structure, and a conductive pattern, are overlaid on the conductive pattern side of a supporting substrate at 100° C. and 3 kg/cm², and adhered thereto at 200 to 300° C. and 10 kg/cm². The copper foil is entirely etched by wet-etching or is etched into a predetermined pattern so as to form a wiring structure. Since the epoxy-acrylate photosensitive resin composition is not treated at 100° C. or more, and hence is in a semi-cured state, the epoxy-acrylate photosensitive resin composition can be heat-bonded onto the supporting substrate.

3 Claims, 6 Drawing Sheets

RESIN LAMINATED WIRING SHEET, WIRING STRUCTURE USING THE SAME, AND PRODUCTION METHOD THEREOF

BACKGROUND OF THE INVENTION

1. Field of the Invention

The present invention relates to wiring substrates preferably used in high-density surface mounting of semiconductor devices and electronic apparatuses.

2. Description of the Related Art

Concomitant with higher density, higher speed, and increase in number of pins of semiconductor devices, surface-mounting boards have been required to have higher mounting density and finer wiring for mounting semiconductor devices or electronic apparatuses. Instead of conventional multilayer printed circuit boards, a multilayer printed circuit board has been formed by a multilayer buildup method and has drawn attention in response to the requirements mentioned above. The conventional multilayer printed circuit boards are formed by laminating prepregs of glass-cloth reinforced resin substrates provided with copper wirings, which is formed by etching beforehand, and then by drilling the laminated prepregs for providing a through hole therein so that wirings formed at different prepregs are connected to each other.

The multilayer buildup circuit boards are formed by steps of forming an insulating layer composed of, for example, an epoxy resin on a printed circuit board which is a core part, forming via holes in the insulating layer by exposing, developing, lasering, and the like, and forming a wiring on the insulating layer by a combination of sputtering, electrolytic plating, electroless plating, and the like. Since the multilayer buildup printed circuit board has no dead space formed by through holes, fine via holes can be formed, and as a result, a mounting substrate can be realized which has a higher mounting density.

In addition, recently, in order to simplify a method for producing the multilayer buildup printed circuit boards so as to reduce production costs therefor, methods has been proposed as disclosed in Japanese Unexamined Patent Publication (JP-A) No. H8-111584 (hereinafter referred to as conventional technique 1), in which copper-clad resin sheets are laminated, and then an insulating step and an electrical connecting step are simultaneously performed.

In particular, in the conventional technique 1, a laminate composed of a plurality of layers, that is, a copper foil, a polyimide sheet, and an adhesive sheet laminated from the top, is adhered on a substrate composed of a glass-cloth reinforced resin having a wiring on the upper surface thereof. Next, the copper foil located at the top is etched to provide an opening for forming a via hole, and then the via hole is formed by etching the polyimide sheet and the adhesive sheet located under the copper foil to the wiring on the substrate. Subsequently, an electroless plating layer is formed on the entire surface of the laminate so as to form an electric connection through the via hole, the copper foil provided at the top and the electroless plating layer are etched into a predetermined pattern so as to form a three dimensional wiring, and as a result, the multilayer buildup printed circuit board is obtained.

Compared to a general production process in which insulating and electrical connecting are sequentially performed, the conventional multilayer buildup printed circuit board has an advantage of simplifying a production process due to simultaneous operations of insulating and electrical connecting.

However, for forming a three dimensional wiring structure, since a subtraction method can only be used which is used for the wiring formation for general printed circuit boards, a fine wiring having a pitch of less than 100 μm is not preferably formed by the conventional multilayer buildup method for the multilayer printed circuit board.

Meanwhile, in the conventional technique 1, wiring may be formed by an additive method which is capable of forming a fine wiring following a step of removing the entire copper foil after the formation of via holes.

However, in the method mentioned above, a step of removing the copper foil is additionally required, so that the advantage of simplifying the process is lost, and in addition, there is a problem in that electric connection reliability through the via holes is degraded since the wiring on the substrate is also etched out.

Accordingly, when an additive method is used, the production process becomes complicated and no advantages can be expected.

SUMMARY OF THE INVENTION

It is an object of the present invention to provide a resin laminated wiring sheet which is capable of forming a fine wiring by using a sheet lamination method effective to simplify a production process, and which is capable of forming multilayer buildup printed circuit boards and mounting boards having superior reliability.

It is another object of the present invention to provide a method for producing the resin laminated wiring sheet.

The problems described above can be solved by a wiring structure produced by a following process. Firstly, a resin laminated wiring sheet is prepared by coating an epoxy-acrylate photosensitive resin composition on a copper foil, etching the epoxy-acrylate photosensitive resin composition on the copper foil into a predetermined pattern by exposing and developing, and forming a conductive pattern composed of a metal deposited by plating at which the photosensitive resin layer is etched. Then, the wiring structure is formed by adhering the resin laminated wiring sheet onto a supporting substrate and etching the copper foil into a predetermined shape.

That is, in accordance with one aspect of the present invention, there is provided a resin laminated wiring sheet which is produced by coating an epoxy-acrylate photosensitive resin composition on a copper foil, etching the epoxy-acrylate photosensitive resin composition on the copper foil into a predetermined pattern by exposing and developing, and forming a conductive pattern composed of a metal deposited by plating at which the photosensitive resin layer is etched.

In accordance with another aspect of the present invention, there is provided a wiring structure formed by coating an epoxy-acrylate photosensitive resin composition on a copper foil, etching the epoxy-acrylate photosensitive resin composition on the copper foil into a predetermined pattern by exposing and developing, forming a conductive pattern composed of a metal deposited by plating at which the photosensitive resin layer is etched, and adhering a conductive pattern of a resin laminated wiring sheet onto a supporting substrate.

In accordance with still another aspect of the present invention, there is provided a method of producing a resin laminated wiring sheet, which comprises the steps of coating an epoxy-acrylate photosensitive resin composition on a copper foil, etching the epoxy-acrylate photosensitive resin composition on the copper foil into a predetermined pattern by exposing and developing, and forming a conductive pattern composed of a metal deposited by plating at which the photosensitive resin layer is etched.

In accordance with yet another aspect of the present invention, there is provided a method of producing a wiring structure which comprises the steps of coating an epoxy-acrylate photosensitive resin composition on a copper foil, etching the epoxy-acrylate photosensitive resin composition on the copper foil into a predetermined shape by exposing and developing, forming a conductive pattern composed of a metal deposited by plating at which the photosensitive resin layer is etched, adhering a conductive pattern of the resin laminated wiring sheet onto a supporting substrate, and etching a copper foil of the resin laminated wiring sheet into a predetermined shape so as to form the wiring structure.

As the epoxy-acrylate photosensitive resin composition which can be used for the present invention, an epoxy-acrylate photosensitive resin composition having a fluorene structure is preferably composed of a general formula (I) represented by chemical formula 1 shown below and on e of a polymerization initiator and a sensitizer.

(n is an integer from 0 to 20, R1 is a carboxylic anhydride, R2 is a hydrogen atom or a lower alkyl group)

Since the epoxy-acrylate photosensitive resin composition has superior resolution compared to various conventional resins, such as a polyimide resin and an epoxy resin, and can be patterned by exposing and developing, the resin laminated wiring sheet provided with a high aspect ratio and a fine wiring pattern can be formed by a simple process using the epoxy-acrylate photosensitive resin composition. In addition, since the epoxy-acrylate photosensitive resin composition having a fluorene structure has not been treated at 100° C. or more, and hence, is in a semi-cured state, the resin laminated wiring sheet can be heat-bonded to any supporting substrates, and the wiring structure provided with a high aspect ratio and fine wiring can be formed by a simple process. Furthermore, when necessary, a multilayer wiring structure can be formed by laminating the resin laminated wiring sheet provided with via holes or bumps.

In Japanese Unexamined Patent Publication (JP-A) No. 10-247772, superior resolution of an epoxy-acrylate photosensitive resin composition having a fluorene structure and a method for forming a conductive wiring pattern using the superior resolution of the epoxy-acrylate photosensitive resin composition mentioned above are disclosed.

However, in the method for forming the conductive wiring pattern and in the step of forming multilayer wiring, an epoxy-acrylate photosensitive resin composition having a fluorene structure are always used in a cured state. The reason for this is that the epoxy-acrylate photosensitive resin composition having a fluorene structure must have heat resistance and chemical resistance which are required by operation conditions, and a wiring structure cannot be formed when the photosensitive resin is in an uncured state.

In contrast, the resin laminated wiring sheet of the present invention can form a conductive wiring pattern by a simple process comprising a step of patterning the epoxy-acrylate photosensitive resin composition having a fluorene structure on the copper foil by exposing and developing, and a step of depositing a metal by electrolytic plating. Consequently, the epoxy-acrylate photosensitive resin composition having a fluorene structure is not necessarily cured, and hence, the wiring structure can be formed by a simple process of heat-bonding the resin laminated wiring sheet onto the supporting substrate.

In addition, the fact that the epoxy-acrylate photosensitive resin composition having a fluorene structure without being treated at 100° C. or more can be heat-bonded to any supporting substrate was first discovered by the inventors through the intensive research and investigation to achieve the present invention, and the above fact cannot be derived from any papers published before.

DESCRIPTION OF THE PREFERRED EMBODIMENTS

Prior to a description of examples of the present invention, to facilitate understanding of the present invention, a resin laminated wiring sheet formed by a conventional technique will be described with reference to FIGS. 1A to 1D.

Referring to FIGS. 1A to 1D, in a conventional technique 1, a sheet composed of a plurality of layers, i.e., a copper foil 11, a polyimide sheet 13, and an adhesive sheet 15 are adhered on a substrate 19 composed of a glass-cloth reinforced resin provided with a wiring 17. Next, the copper foil 11 is etched so as to provide openings therein for forming via holes, and then the polyimide sheet 13 and the adhesive sheet 15 are etched so as to provide via holes 21. Subsequently, an electroless plating layer 23 is formed so as to cover the copper foil 11 and the wiring 17 in order to form an electric connection through the via holes 21. Finally, a multilayer buildup printed circuit board 27 was obtained by etching the copper foil 11 and the electroless plating layer 23 in a predetermined pattern.

Now, examples of the present invention will be described with reference to FIGS. 2A to 6D.

EXAMPLE 1

Figure 1A:
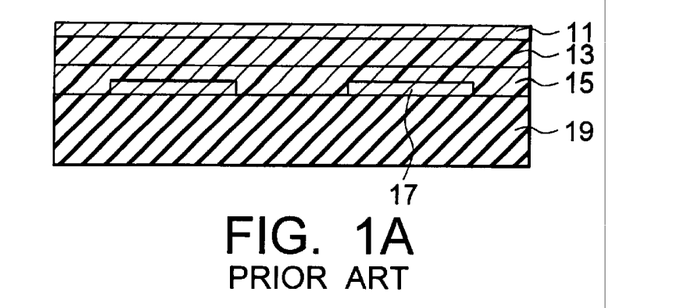
FIGS. 1A through 1D are schematic cross-sectional views of production steps for multilayer buildup circuit boards formed by laminating conventional copper-clad resin sheets.
Figure 1B:
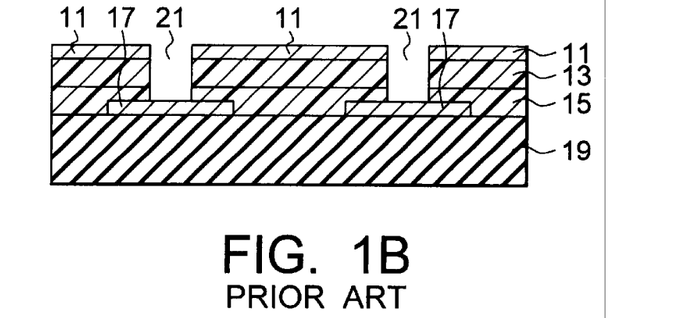
Figure 1C:
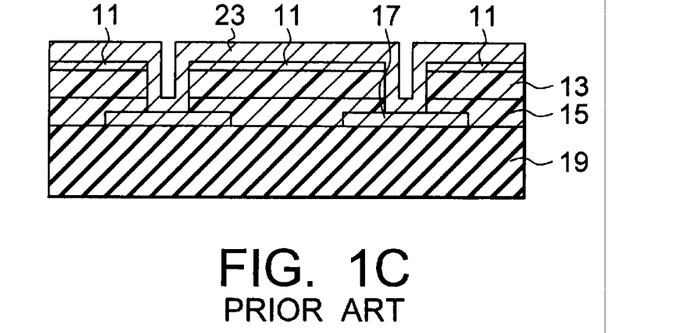
Figure 1D:
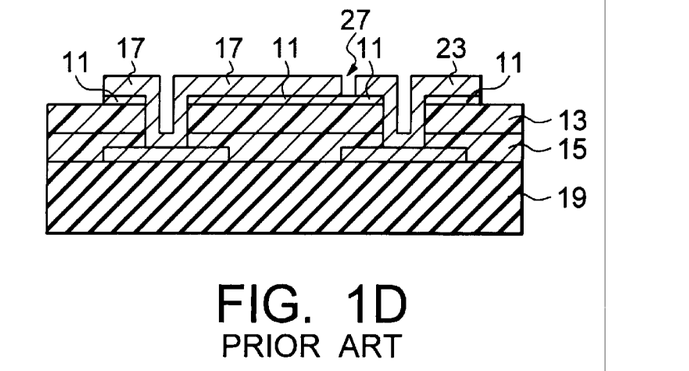
Figure 2A:
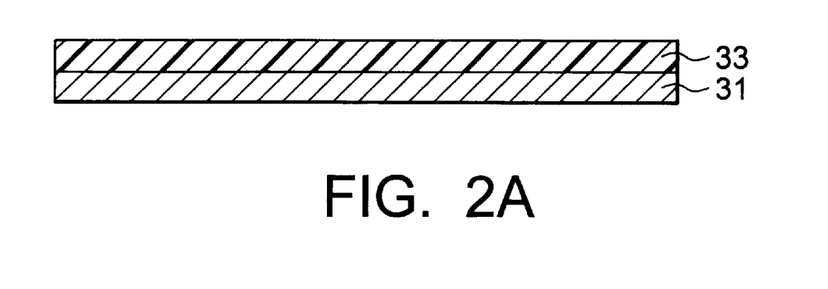
FIGS. 2A through 2D are cross-sectional views showing an example of production steps for a resin laminated wiring sheet according to a first embodiment of the present invention.
Figure 2B:
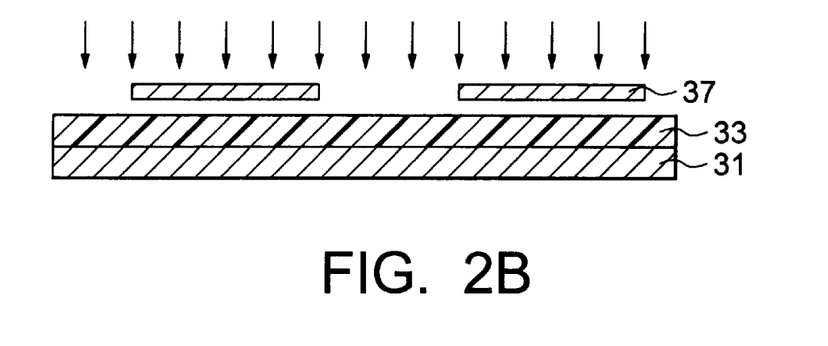
Figure 2C:
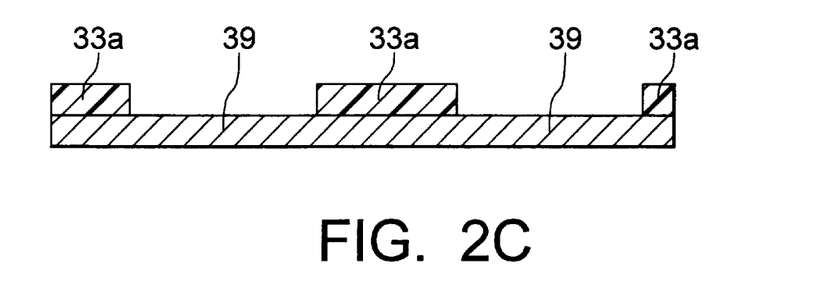
Figure 2D:
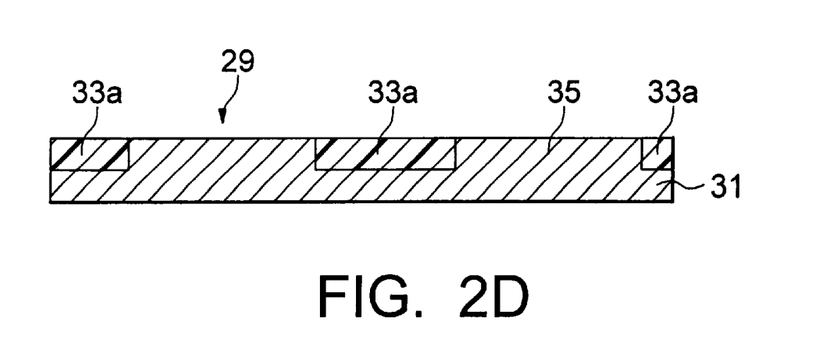

Referring to FIG. 2D, a resin laminated wiring sheet 29 according to the example 1 was formed by a step of coating an epoxy-acrylate photosensitive resin composition 33, having a fluorene structure, on a copper foil 31, a step of etching the photosensitive resin composition 33 on the copper foil 31 by exposing and developing into a predetermined pattern, and a step of depositing a metal by plating at which the photosensitive resin composition 33 was etched so as to form a conductive pattern 35.

In particular, as shown in FIG. 2A, firstly, the epoxy-acrylate photosensitive resin composition 33 having a fluorene structure, such as V259PA of Nippon Steel Chemical Co., Ltd., was coated on the copper foil 31. The epoxy-acrylate photosensitive resin composition 33 having a fluorene structure, which is, for example, dissolved in propylene glycol mono-methyl ether acetate and in the form of varnish, can be coated by spin coating, curtain coating, die coating, or the like. In addition, a dry film composed of the photosensitive resin composition 33 may be laminated on the copper foil 31 instead of coating.

Next, as shown in FIG. 2B, residual solvent for the epoxy-acrylate photosensitive resin composition 33 had a fluorene structure and was removed by drying at approximately 60° C. to 90° C. for 5 to 90 minutes, and then the photosensitive resin composition 33 was exposed, for example, through a glass mask 37.

By developing unexposed areas of the photosensitive resin composition 33 using an aqueous solution containing sodium carbonate at a concentration of 1%, etched areas 39 were obtained as shown in FIG. 2C.

Next, as shown in FIG. 2D, a metal was deposited so as to form a conductive pattern 35 by electrolytic plating using current flowed through the copper foil 31, and as a result, the resin laminated wiring sheet 29 was obtained.

Since the epoxy-acrylate photosensitive resin composition 33 having a fluorene structure has superior resolution, a fine wiring having an aspect ratio of not less than 0.5 and a pitch of 20μm can be formed.

When the conductive pattern 35 is formed, electrolytic copper plating is generally used; however, when necessary, a multilayer metal structure is formed by plural plating in some cases. This plating method mentioned above is an advantageous method for forming a wiring structure using the resin laminated wiring sheet of the present invention. As an example, the conductive pattern 35, which is formed by electrolytic gold plating to a thickness of 0.01 to 10 μm on the copper foil 31 followed by electrolytic copper plating, is preferable. The object and the advantage of this plating method will be particularly described later.

EXAMPLE 2

Figure 3A:
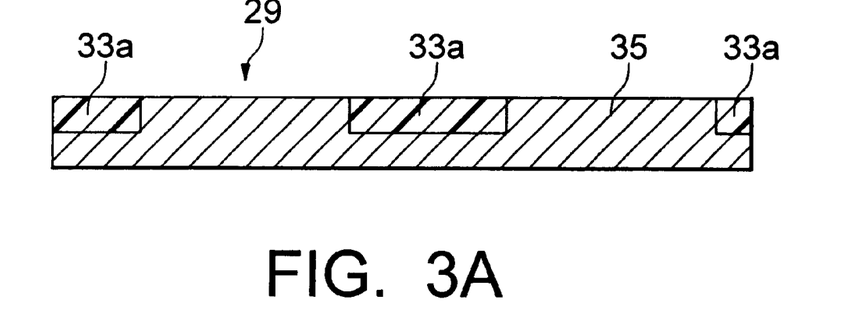
FIGS. 3A and 3B are cross-sectional views showing an example of production steps for a resin laminated wiring sheet provided with via holes according to a second embodiment of the present invention.
Figure 3B:
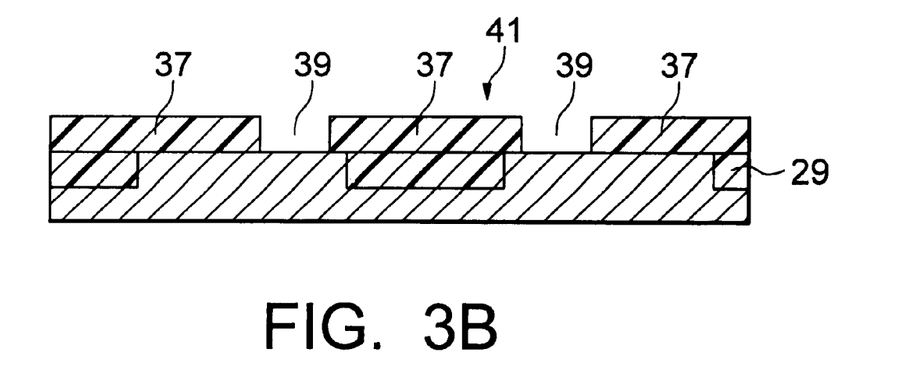

In FIG. 3B, via holes were formed in an adhesive resin layer which was provided by coating an adhesive resin on the conductive pattern 35 of the wiring resin sheet 29 shown in FIG. 2D.

In particular, as shown in FIGS. 3A and 3B, by forming an adhesive resin layer 37 on the conductive pattern 35 of the resin laminated wiring sheet 29 described above followed by forming via holes in the adhesive resin layer 37, a resin laminated wiring sheet 41 can be obtained which is provided with via holes.

It is preferable that the via holes 39 may be provided by exposing and developing an epoxy-acrylate photosensitive resin composition having a fluorene structure which is used as the adhesive resin layer 37 since the method mentioned above can mostly simplify the process thereof. However, when necessary, there are other methods, in which an adhesive resin layer 37 is formed of an epoxy resin, a polyimide resin, or the like, and the via holes 39 are formed by a laser method, such as, an excimer laser, an ultraviolet-yttrium-aluminum-garnet (UV-YAG) laser, or a carbon dioxide laser.

EXAMPLE 3

Figure 4:
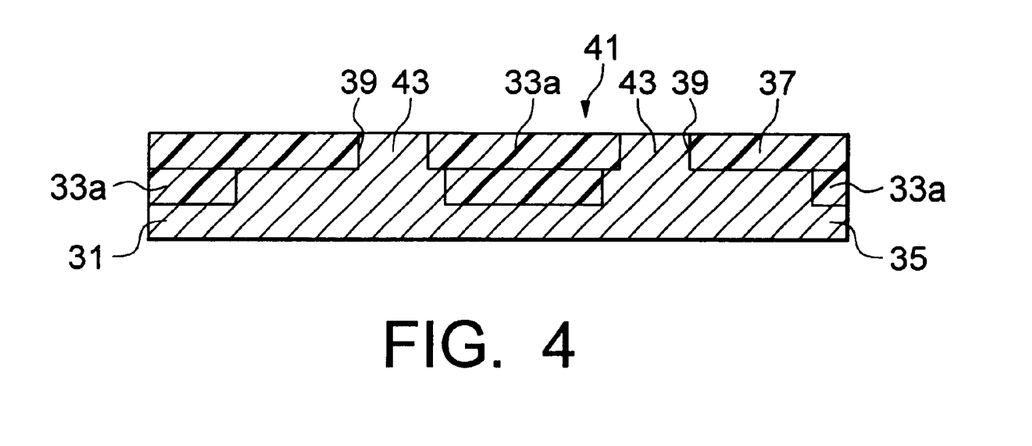
FIG. 4 is a schematic cross-sectional view showing an example of a resin laminated wiring sheet provided with bumps according to a third embodiment of the present invention.

Referring to FIG. 4, bumps 43 are formed of a metal deposited by plating in the via holes 39 of the resin laminated wiring sheet 41 having via holes shown in FIG. 3.

A resin laminated wiring sheet 41 provided with the bumps 43 can be obtained, in particular, by forming the bumps 43 in the via holes 39 of the resin laminated wiring sheet 41 having via holes by depositing a metal by plating using current flowed through the copper foil 31. For the formation of the bumps 43, electrolytic copper plating is generally used; however, when necessary, a multilayer metal structure is formed by performing plural plating in some cases, similar to that for the formation of the conductive pattern 35. As an example, a method for forming the bumps 43, in which a copper layer having a predetermined thickness is formed by copper plating, and a gold layer having a thickness of 0.01 to 10 μm is formed on the copper layer by gold plating, is preferable. The object and advantage thereof will be particularly described later.

EXAMPLE 4

Referring to FIGS. 5A to 5F, a wiring structure was formed by adhering the resin laminated wiring sheet, which was described with reference to FIGS. 2A to 2D, 3A and 3B, and 4, to a supporting substrate at the conductive pattern side, and then by etching the copper foil into a predetermined pattern.

Figure 5A:
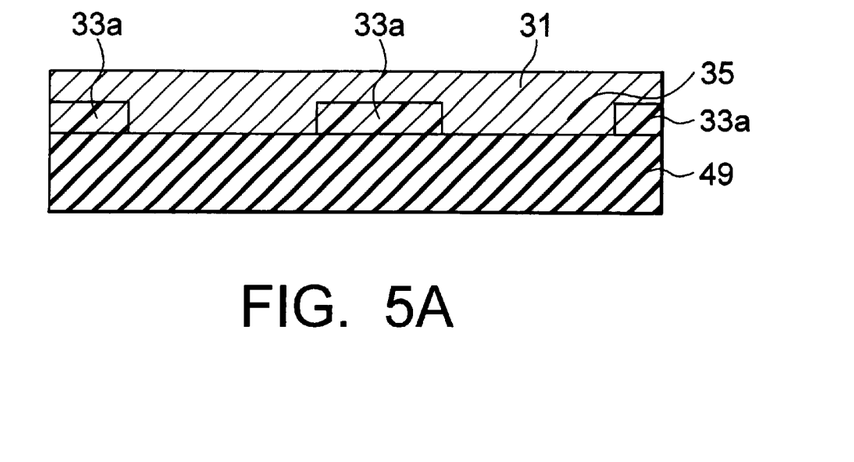
FIGS. 5A through 5F are cross-sectional views showing an example of production steps for a wiring structure according to a fourth embodiment of the present invention.

In particular, as shown in FIG. 5A, the resin laminated wiring sheet 29 was overlaid on a supporting substrate 49 at the conductive pattern 35 side under the conditions, for example, at 100° C. and at 3 kg/cm², and was then adhered to the supporting substrate 49 under the conditions at 200 to 300° C. and at 10 kg/cm².

Figure 5B:
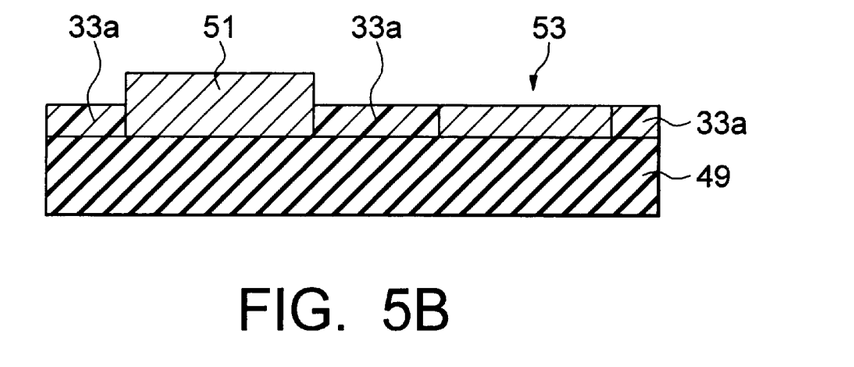

Finally, as shown in FIG. 5B, when the resin laminated wiring sheet 29 was provided on the supporting substrate to obtain a wiring structure 53 which was formed by wet-etching the whole copper foil or by etching the copper foil into a copper wiring 51, the epoxy-acrylate photosensitive resin composition 33a having a fluorene structure was in a semi-cured state since a temperature of not less than 100° C. was not applied thereto. Hence, the epoxy-acrylate photosensitive resin composition 33a can be adhered onto the supporting substrate 49 under the conditions mentioned above.

Figure 5C:
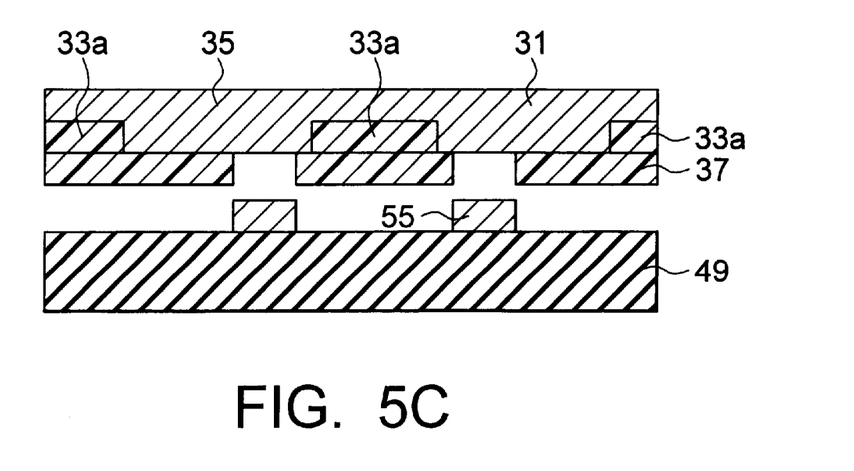
Figure 5D:
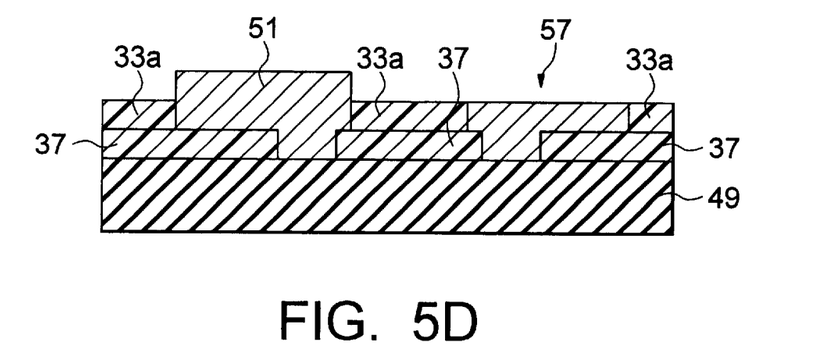

When the supporting substrate 49 was provided with conductive bumps 55, as shown in FIGS. 5C and 5D, a wiring structure 57 can be obtained by adhering the resin laminated wiring sheet 41 provided with via holes onto the supporting substrate 49.

Figure 5E:
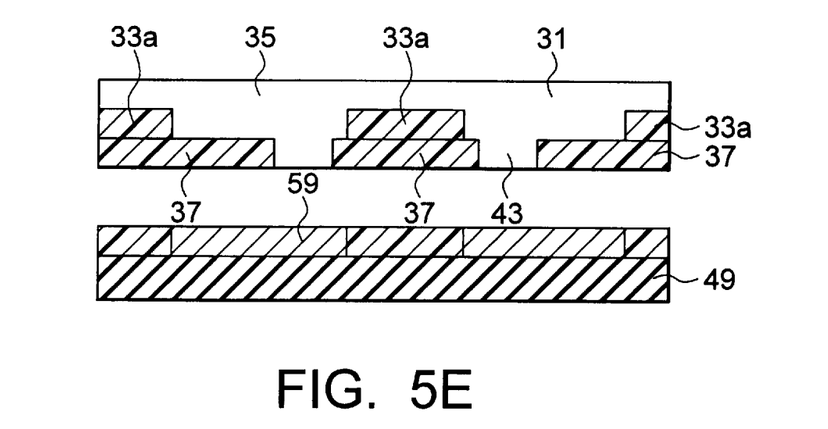
Figure 5F:
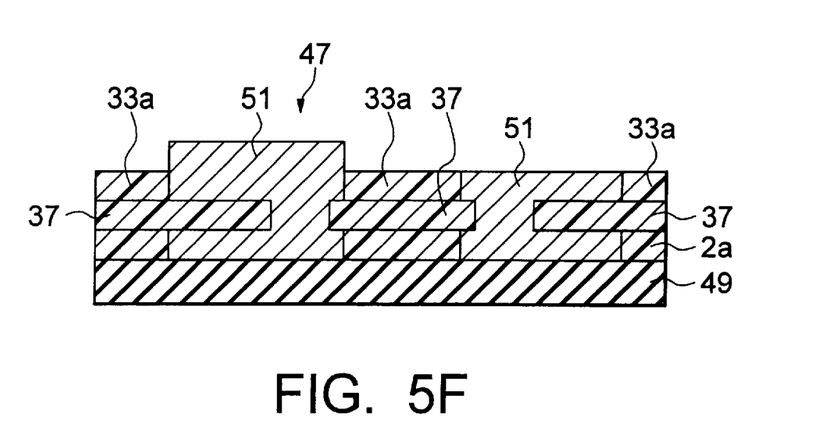

When the supporting substrate 49 was provided with conductive wirings 59, as shown in FIGS. 5E and 5F, the wiring structure 47 can be obtained by adhering a resin laminated wiring sheet 45 provided with bumps onto the supporting substrate 49.

Generally, any material can be used for the supporting substrate 49 so long as a material can withstand a heating condition of approximately 200° C., and an insulating substrate and a semiconductor substrate can be used. As an insulating material, a resin film, a glass-cloth reinforced resin (for use in printed circuit board), a ceramic, glass, and the like can be used.

In the case in which a multilayer wiring structure is specifically formed using the resin laminated wiring sheet of the present invention, a multilayer wiring structure with superior wiring accuracy and reliable electrical connection can be obtained by using the resin laminated wiring sheet provided with the conductive pattern 35 and the bumps 43, which are plated with gold having a thickness of 0.01 to 10 $\mu$m by electrolytic plating.

EXAMPLE 5

Figure 6A:
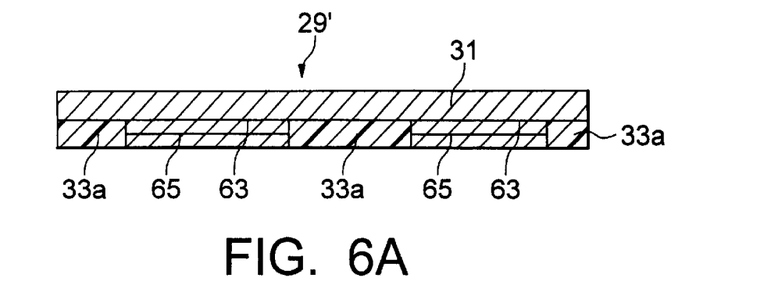
FIGS. 6A through 6D are cross-sectional views showing an example of production steps for a multilayer circuit structure formed by a resin laminated wiring sheet according to a fifth embodiment of the present invention.

Referring to FIG. 6A, a resin laminated copper foil sheet 29' was prepared, in which a conductive pattern 35 was composed of a gold layer 63 and a copper layer 65 formed by electrolytic plating.

Figure 6B:
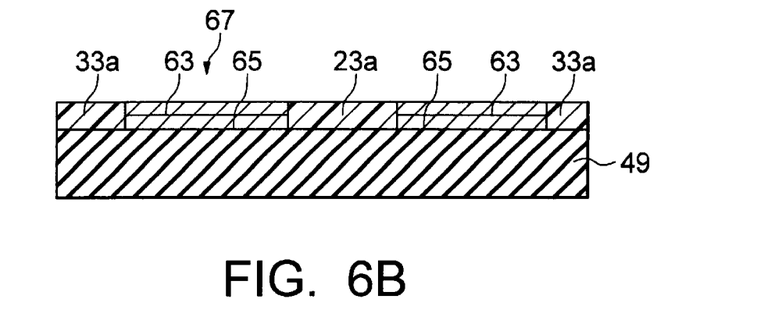

Next, as shown in FIG. 6B, a wiring structure 67 was obtained by wet-etching the entire copper foil 31 after the resin laminated copper foil sheet 29' was heat-bonded onto the supporting substrate 49. When wet-etching was performed, since the conductive pattern 35 was provided with the gold layer 63 beforehand, the conductive pattern 35 was not etched even though the wet etching conditions for the copper foil 31 was excessively severe. Consequently, the wiring structure 67 having a fine and accurate conductive pattern can be formed without being influenced by etching conditions.

Figure 6C:
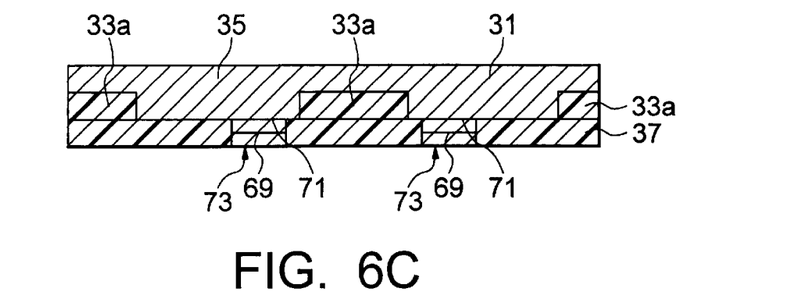
Figure 6D:
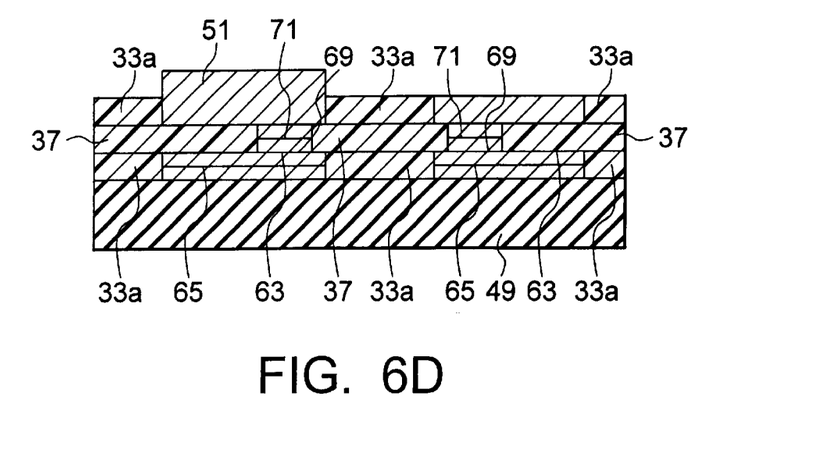

Next, as shown in FIG. 6C, a resin laminated wiring sheet 61 having bumps 73 composed of a gold layer 69 and a copper layer 71, which were formed by electrolytic plating, was prepared, and as shown in FIG. 6D, after the resin laminated wiring sheet 61 was heat-bonded onto the wiring structure 67, a wiring structure 75 was formed by etching the copper foil 31 into a copper wiring 51 having a predetermined shape. When the resin laminated wiring sheet 61 was adhered onto the wiring structure 67, since the gold layer 63 and the gold layer 69 mutually caused metal migration by heat-bonding, the multilayer wiring structure 75 having a superior reliability of electric connection can be formed.

As has thus been described, the resin laminated wiring sheet of the present invention is produced by a process comprising the steps of coating an epoxy-acrylate photosensitive resin composition having a fluorene structure on a copper foil, etching the photosensitive resin on the copper foil into a predetermined shape by exposing and developing, and depositing a metal by plating at which the photosensitive resin was etched so as to form a conductive pattern. As a result, a resin laminated wiring sheet having a fine wiring and a high aspect ratio can be formed.

Consequently, a production process can be simplified by a wiring structure formed by etching the copper foil of the resin laminated wiring sheet after adhering the resin laminated wiring sheet at a conductive pattern side thereof onto a supporting substrate, whereby production cost can be reduced, a fine wiring can be formed, and reliable multilayer buildup printed circuit boards and mounting boards can be obtained.

What is claimed is:

1. A method of producing a resin laminated wiring sheet comprising the steps of:

coating an epoxy-acrylate photosensitive resin composition on a copper foil;

etching the epoxy-acrylate photosensitive resin composition on the copper foil into a shape by exposing and developing;

forming a first conductive pattern by plating a metal on the copper foil in locations where the photosensitive resin layer was etched away;

coating an adhesive resin on the first conductive pattern and providing a via hole in the adhesive resin;

providing a second conductive pattern on a supporting substrate, the second conductive pattern corresponding to the via hole in the adhesive resin; and attaching the substrate to the adhesive resin with the second conductive pattern in the via hole.

2. A method according to claim 1, wherein the epoxy-acrylate photosensitive resin composition comprises an epoxy-acrylate resin having a fluorene structure and one of a polymerization initiator and a sensitizer.

3. A method according to claim 1, further comprising the step of etching the copper foil to form a wiring pattern on a surface of the wiring sheet opposite the supporting substrate.

* * * * *